(12) United States Patent
Feustel et al.

(10) Patent No.: US 7,879,709 B2
(45) Date of Patent: Feb. 1, 2011

(54) SEMICONDUCTOR STRUCTURE COMPRISING AN ELECTRICALLY CONDUCTIVE FEATURE AND METHOD OF FORMING A SEMICONDUCTOR STRUCTURE

(75) Inventors: Frank Feustel, Dresden (DE); Tobias Letz, Dresden (DE); Carsten Peters, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 246 days.

(21) Appl. No.: 12/060,563

(22) Filed: Apr. 1, 2008

(65) Prior Publication Data
US 2009/0085145 A1 Apr. 2, 2009

(30) Foreign Application Priority Data
Sep. 29, 2007 (DE) .................. 10 2007 046 851

(51) Int. Cl.
*H01L 21/00* (2006.01)
(52) U.S. Cl. .................. 438/589; 438/270; 257/741
(58) Field of Classification Search ............ 438/589, 438/270; 257/741
See application file for complete search history.

(56) References Cited

U.S. PATENT DOCUMENTS

| | | | | |
|---|---|---|---|---|
| 4,680,601 | A | | 7/1987 | Mitlehner et al. .............. 357/15 |
| 5,566,045 | A | * | 10/1996 | Summerfelt et al. ...... 361/321.1 |
| 5,990,011 | A | * | 11/1999 | McTeer ...................... 438/692 |
| 6,017,817 | A | * | 1/2000 | Chung et al. ................ 438/637 |
| 6,025,264 | A | * | 2/2000 | Yew et al. ................... 438/627 |
| 6,074,925 | A | | 6/2000 | Aisou .......................... 438/365 |
| 6,124,203 | A | * | 9/2000 | Joo et al. .................... 438/653 |
| 6,130,156 | A | * | 10/2000 | Havemann et al. .......... 438/637 |
| 6,144,096 | A | * | 11/2000 | Lopatin ....................... 257/751 |
| 6,204,134 | B1 | | 3/2001 | Shih ........................... 438/301 |
| 6,204,179 | B1 | * | 3/2001 | McTeer ....................... 438/687 |
| 6,214,731 | B1 | * | 4/2001 | Nogami et al. .............. 438/687 |
| 6,242,349 | B1 | * | 6/2001 | Nogami et al. .............. 438/687 |
| 6,287,964 | B1 | | 9/2001 | Cho ............................ 438/643 |
| 6,291,333 | B1 | * | 9/2001 | Lou ............................ 438/618 |
| 6,365,506 | B1 | * | 4/2002 | Chang et al. ................. 438/624 |
| 6,391,777 | B1 | * | 5/2002 | Chen et al. .................. 438/687 |
| 6,417,095 | B1 | * | 7/2002 | Chen ........................... 438/633 |
| 6,429,118 | B1 | * | 8/2002 | Chen et al. .................. 438/629 |
| 6,429,121 | B1 | * | 8/2002 | Hopper et al. .............. 438/636 |
| 6,482,740 | B2 | * | 11/2002 | Soininen et al. ............. 438/686 |

(Continued)

FOREIGN PATENT DOCUMENTS

JP 06232269 8/1994

OTHER PUBLICATIONS

PCT Search Report and Written Opinion from PCT/US2008/011254 dated Jan. 30, 2009.

(Continued)

*Primary Examiner*—Jarrett J Stark
*Assistant Examiner*—Nicholas Tobergte
(74) *Attorney, Agent, or Firm*—Williams, Morgan & Amerson, P.C.

(57) ABSTRACT

A semiconductor structure comprises a semiconductor substrate. A layer of an electrically insulating material is formed over the semiconductor substrate. An electrically conductive feature is formed in the layer of electrically insulating material. A first layer of a semiconductor material is formed between the electrically conductive feature and the layer of electrically insulating material.

18 Claims, 5 Drawing Sheets

U.S. PATENT DOCUMENTS

| | | | | |
|---|---|---|---|---|
| 6,492,270 | B1 * | 12/2002 | Lou | 438/687 |
| 6,495,448 | B1 * | 12/2002 | Lee | 438/624 |
| 6,511,905 | B1 | 1/2003 | Lee et al. | 438/629 |
| 6,680,542 | B1 * | 1/2004 | Gibson et al. | 257/774 |
| 6,686,662 | B2 * | 2/2004 | Merchant et al. | 257/751 |
| 6,693,356 | B2 * | 2/2004 | Jiang et al. | 257/767 |
| 6,921,712 | B2 * | 7/2005 | Soininen et al. | 438/597 |
| 6,943,096 | B1 * | 9/2005 | Wang et al. | 438/484 |
| 7,125,791 | B2 * | 10/2006 | Liu | 438/622 |
| 7,241,677 | B2 * | 7/2007 | Soininen et al. | 438/597 |
| 2002/0030283 | A1 * | 3/2002 | Itabashi et al. | 257/774 |
| 2003/0127738 | A1 | 7/2003 | Lee et al. | 257/751 |
| 2008/0050851 | A1 * | 2/2008 | Tanaka et al. | 438/29 |
| 2008/0057604 | A1 * | 3/2008 | Tanaka | 438/29 |
| 2008/0188076 | A1 * | 8/2008 | Morinaga et al. | 438/648 |

OTHER PUBLICATIONS

Translation of Official Communication from German Patent Application No. 10 2007 046 851.4 dated Aug. 1, 2008.

* cited by examiner

| # SEMICONDUCTOR STRUCTURE COMPRISING AN ELECTRICALLY CONDUCTIVE FEATURE AND METHOD OF FORMING A SEMICONDUCTOR STRUCTURE

BACKGROUND OF THE INVENTION

1. Field of the Invention

The present disclosure generally relates to the manufacture of integrated circuits, and, more particularly, to the formation of electrically conductive lines connecting circuit elements of an integrated circuit.

2. Description of the Related Art

Integrated circuits comprise a large number of individual circuit elements, e.g., transistors, capacitors and resistors, formed on and in a substrate. These elements are connected internally by means of electrically conductive lines to form complex circuits such as memory devices, logic devices and microprocessors. To accommodate all the electrically conductive lines required to connect the circuit elements in modern integrated circuits, the electrically conductive lines may be arranged in a plurality of levels stacked on top of each other. To connect electrically conductive lines provided in different levels, contact vias are formed in dielectric layers separating the levels from each other. These vias are then filled with an electrically conductive material.

Figure 1A:
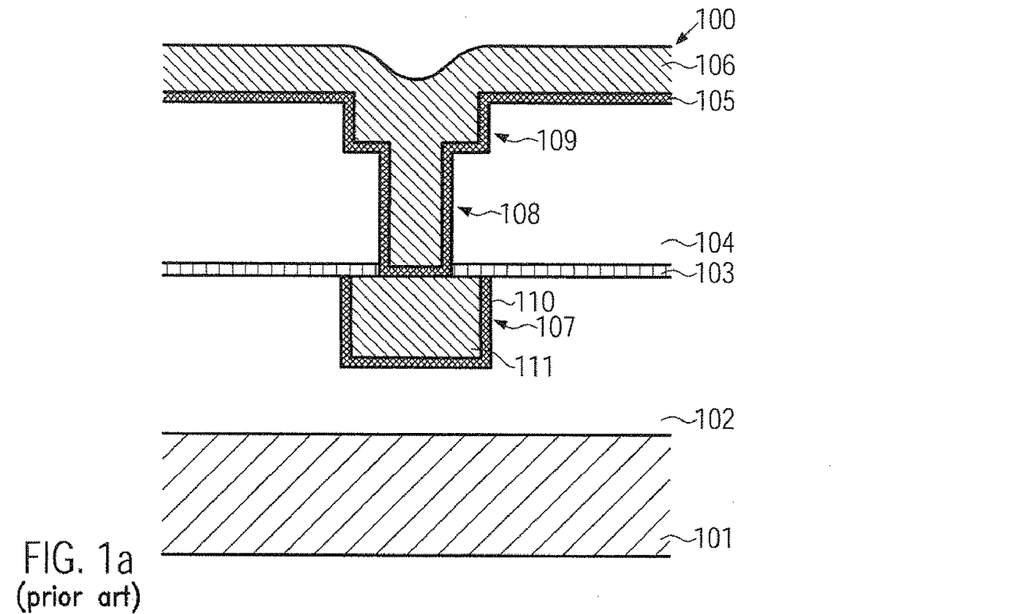
FIGS. 1a-1b show schematic cross-sectional views of a semiconductor structure in stages of a method of forming an electrically conductive line according to the state of the art.

A method of forming an electrically conductive line according to the state of the art will now be described with reference to FIGS. 1a-1b. FIG. 1a shows a schematic cross-sectional view of a semiconductor structure 100 in a first stage of the method of forming an electrically conductive line according to the state of the art.

A semiconductor substrate 101 is provided. The semiconductor substrate 101 may comprise a plurality of circuit elements and, optionally, electrically conductive lines in lower interconnect levels. The semiconductor substrate 101 further comprises a first dielectric layer 102 formed thereon. A trench 107 is formed in the dielectric layer 102. In the trench 107, a trench fill 111 comprising an electrically conductive material, for example, a metal such as copper, is provided. The trench fill 111 forms an electrically conductive line. A diffusion barrier layer 110 separates the trench fill 111 from the first dielectric layer 102. Thus, a diffusion of the material of the trench fill 111 into the first dielectric layer 102 may be prevented and an adhesion between the trench fill 111 and the dielectric material of the first dielectric layer 102 may be improved. The semiconductor substrate 101 may be formed by means of methods known to persons skilled in the art comprising advanced techniques of deposition, oxidation, ion implantation, etching and photolithography.

An etch stop layer 103 is formed over the semiconductor substrate 101. In addition to the surface of the first dielectric layer 102, the etch stop layer 103 covers an exposed top surface of the trench fill 111. A second dielectric layer 104 is formed on the etch stop layer 103. The second dielectric layer 104 may comprise substantially the same material as the first dielectric layer 102. The etch stop layer 103 and the second dielectric layer 104 may be formed by means of methods known to persons skilled in the art, such as chemical vapor deposition, plasma enhanced chemical vapor deposition and spin coating.

A contact via 108 and a trench 109 are formed in the second dielectric layer 104. The formation of the contact via 108 may comprise photolithographically forming a mask (not shown) which does not cover a portion of the surface of the second dielectric layer 104 at the location where the contact via 108 is to be formed. Then, an etch process is performed. To this end, the semiconductor structure 100 may be exposed to an etchant adapted to selectively remove the material of the second dielectric layer 104, leaving the etch stop layer 103 essentially intact. Thus, the etch process may stop as soon as the etch front reaches the etch stop layer 103.

The etch process may be anisotropic. In anisotropic etching, a rate at which material is removed from the etched surface depends on the orientation of the surface. The etch rate of substantially horizontal portions of the etched surface being substantially parallel to the surface of the semiconductor substrate 101 may be significantly greater than the etch rate of inclined portions of the etched surface. Thus, substantially no material below the mask is removed and the via 108 obtains substantially vertical sidewalls.

Thereafter, the mask may be removed, which may be done by means of a resist strip process known to persons skilled in the art, and the trench 109 is formed. Similar to the formation of the contact via 108, the trench 109 may be formed by photolithographically forming a mask on the semiconductor structure 100 and performing an anisotropic etch process.

Subsequently, a portion of the etch stop layer 103 exposed at the bottom of the contact via 108 may be removed. The exposed portion of the etch stop layer 103 may be removed by means of an etch process adapted to selectively remove the material of the etch stop layer 103, leaving the materials of the second dielectric layer 104 and the trench fill 111 substantially intact.

A diffusion barrier layer 105 may be deposited on the semiconductor structure 100. In particular, the diffusion barrier layer 105 may cover the sidewalls and the bottom of the trench 109 and the contact via 108. This may be done by means of known methods, such as chemical vapor deposition, plasma enhanced chemical vapor deposition and/or sputter deposition. Then, a layer 106 of an electrically conductive material, for example copper, is formed on the diffusion barrier layer 105. For this purpose, methods of electroplating known to persons skilled in the art may be employed.

The diffusion barrier layer 105 may comprise materials such as titanium nitride, tantalum and/or tantalum nitride which may prevent a diffusion of the electrically conductive material of the layer 106 into the second dielectric layer 104 and other portions of the semiconductor structure 100. In particular, in methods of forming an electrically conductive line according to the state of the art wherein the electrically conductive material comprises copper, the diffusion barrier layer 105 may prevent a diffusion of copper into circuit elements such as field effect transistors formed in the semiconductor structure 100. This may help to avoid adverse effects of the presence of copper on the functionality of the field effect transistors.

Figure 1B:
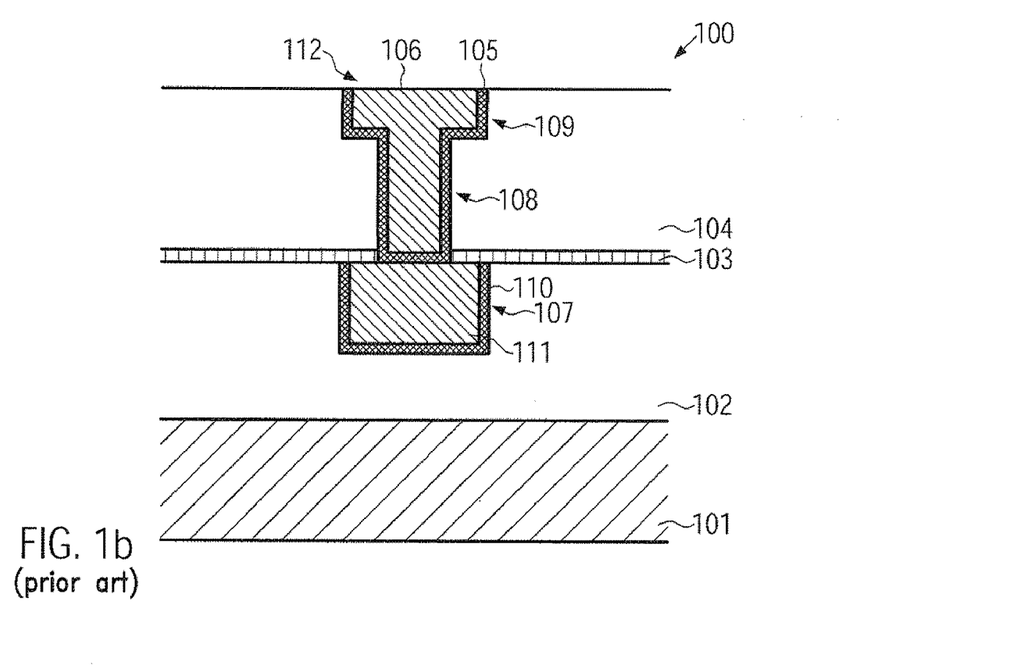

FIG. 1b shows a schematic cross-sectional view of the semiconductor structure 100 in a later stage of the method of forming an electrically conductive line according to the state of the art. The surface of the semiconductor structure 100 may be planarized, for example, by means of a known chemical mechanical polishing process. In the planarization, portions of the diffusion barrier layer 105 and the layer 106 outside the trench 109 and the contact via 108 are removed and a substantially planar surface of the semiconductor structure 100 is obtained. Residues of the layer 106 in the trench 109 form an electrically conductive line 112. Residues of the layer 106 in the contact via 108 provide an electrical contact between the electrically conductive line 112 in the trench 109 and the trench fill 111 in the trench 107.

As feature sizes in the semiconductor structure 100 are reduced, sizes of the trenches 107, 109 and the contact via 108, and the amount of electrically conductive material in the trenches 107, 109 and the contact via 108 are also reduced. Such a size reduction may lead to an increase of the electrical resistance of the respective features, in particular to an increase of the electrical resistance of the electrically conductive line 112, which may increase signal propagation delays and the amount of heat created by line losses. Therefore, when reducing feature sizes, it may be desirable to control the electrical resistance of the electrically conductive line 112.

The electrical resistance of the electrically conductive line 112 may be influenced by the scattering of charge carriers in the electrically conductive line 112. Scattering of charge carriers may occur, in particular, at grain boundaries of the material of the layer 106, and at interfaces between the electrically conductive line 112 and other components of the semiconductor structure 100.

In the prior art, it has been proposed to reduce the likelihood of a scattering of charge carriers at grain boundaries by controlling the grain size of the material of the layer 106, which may be done by varying parameters of the process used in the formation of the layer 106 and/or by means of an annealing process. However, as the dimension of the electrically conductive line 112 is reduced to about 100 nm or less, the scattering of charge carriers at interfaces between the electrically conductive line 112 and other components of the semiconductor structure 100 may influence the conductivity of the electrically conductive line 112.

Figure 2:
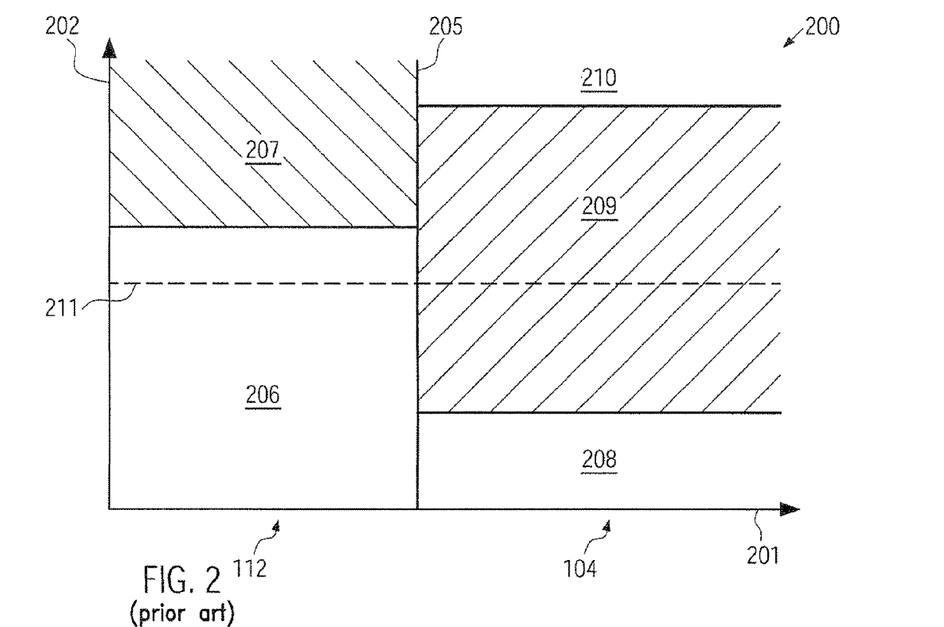
FIG. 2 shows a schematic band chart of an interface between an electrically conductive line and a dielectric layer in a semiconductor structure according to the state of the art.

FIG. 2 shows a schematic band chart 200 of an interface between the electrically conductive line 112 and the second dielectric layer 104. For simplicity, the diffusion barrier layer 105, which, in examples of electrically conductive lines according to the state of the art, does not contribute significantly to the electric conduction in the electrically conductive line 112, has been omitted.

In FIG. 2, a first coordinate axis 201 denotes a position along a lateral direction being substantially parallel to the surface of the substrate 101, and a second coordinate axis 202 denotes an energy of electrons. A line 205 denotes the location of the interface between the electrically conductive line 112 and the second dielectric layer 104. The band structure of the metal in the electrically conductive line 112 is shown on the left side of the line 205, and the band structure of the insulating material of the layer 104 is shown on the right side of the line 205.

The material of the electrically conductive line 112 comprises a conduction band 206 and an interband energy gap 207. A line 211 indicates a Fermi level of the semiconductor structure 100. As persons skilled in the art know, the Fermi level 211 may be substantially constant throughout the semiconductor structure 100, and electron states having an energy smaller than the Fermi level 211 have a high probability of being occupied by an electron, whereas electron states having an energy higher than the Fermi level have a low probability of being occupied by an electron. In the electrically conductive line 112, when comprising a metal, the Fermi level 211 is in the conduction band 206 such that the conduction band 206 is partially occupied with electrons.

The material of the second dielectric layer 104 comprises a valence band 208 and a conduction band 210, which are separated by an interband energy gap 209. In the second dielectric layer 104, when comprising an electrically insulating material, the Fermi level 211 lies within the interband energy gap 209. Hence, the valence band 208 is occupied with electrons, whereas the conduction band 210 is substantially empty.

An electron approaching the interface 205 between the electrically conductive line 112 and the second dielectric layer 104 may not enter a state in the valence band 208 of the material of the second dielectric layer 104, since substantially all electron states in the valence band 208 are occupied by electrons. In order to enter the conduction band 210 of the material of the second dielectric layer 104, the electron would have to overcome a relatively high potential barrier having a size corresponding to the difference between the energy of the lowest energy states in the conduction band 210 and the Fermi level 211. This potential barrier may hinder the electron from entering the material of the second dielectric layer 104. Therefore, there is a relatively high likelihood that the electron will be scattered at the interface between the electrically conductive line 112 and the second dielectric material 104.

It is, therefore, a problem of the above-described method of forming a semiconductor structure according to the state of the art that scattering of charge carriers at interfaces between the electrically conductive lines and other components of the semiconductor structure 100 may increase the electrical resistance of the electrically conductive line 112.

The present disclosure is directed to various methods and structures that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative embodiment, a semiconductor structure comprises a semiconductor substrate. A layer of an electrically insulating material is formed over the semiconductor substrate. An electrically conductive feature is formed in the layer of electrically insulating material. A first layer of a semiconductor material is formed between the electrically conductive feature and the layer of electrically insulating material.

According to another illustrative embodiment, a method of forming a semiconductor structure comprises providing a semiconductor substrate comprising a layer of an electrically insulating material. A recess is formed in the layer of electrically insulating material. A first layer of semiconductor material is formed over the recess. An electrically conductive feature is formed on the first layer of semiconductor material. At least a portion of the electrically conductive feature is provided in the recess.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to one embodiment, a semiconductor structure comprises a layer of a semiconductor material which is provided between a layer of an electrically insulating material and an electrically conductive feature. In some embodiments, the layer of electrically insulating material may comprise an interlayer dielectric, for example, silicon oxide, silicon nitride, silicon oxynitride, or a low-k material, for example, an organosilicate glass. The electrically conductive feature may comprise an electrically conductive line connecting circuit elements formed in the semiconductor structure. In some embodiments, the electrically conductive feature may be formed in the layer of electrically insulating material by means of a damascene process, wherein a recess is formed in the layer of electrically insulating material, and the recess is filled with an electrically conductive material after depositing a layer of the semiconductor material over the recess. The recess may comprise a contact via and/or a trench.

In some embodiments, the electrically conductive feature may comprise a metal and the semiconductor material may be selected such that a Schottky barrier is formed at an interface between the electrically conductive feature and the semiconductor material. In one embodiment, the metal may comprise copper, and the semiconductor material may comprise a P-doped semiconductor material, for example, P-doped zinc oxide. At the interface between the metal and the P-doped semiconductor material, electrons from the metal may recombine with holes from the semiconductor material. In the vicinity of the interface between the P-doped semiconductor material and the metal, the recombination of charge carriers may lead to a decrease of the concentration of electrons in the metal and to a decrease of the concentration of holes in the semiconductor. Thus, a negative space charge is formed in the semiconductor material and a positive space charge is formed in the metal. The presence of the space charge may lead to a creation of an electric field in the vicinity of the interface, wherein a direction of the electric field is such that electrons are drawn towards the metal and holes are drawn towards the semiconductor material.

If an electric current is flowing through the metal in the electrically conductive feature, and an electron is approaching the interface between the electrically conductive feature, the electric field at the interface may exercise a force on the electron such that the electron is drawn away from the interface, towards the volume of the electrically conductive feature. This may help to reduce a likelihood that the electron is scattered at the interface.

The present subject matter is not restricted to embodiments wherein the electrically conductive feature comprises a metal. In other embodiments, the electrically conductive feature may comprise a second semiconductor material which is different from the material of the layer of semiconductor material. In the following, the material of the layer of semiconductor material will be denoted as "first semiconductor material." The doping of the first semiconductor material may be inverse to the doping of the second semiconductor material. Hence, a P-N transition may be provided at the interface between the electrically conductive feature and the layer of semiconductor material.

In some embodiments, the first semiconductor material may be P-doped and the second semiconductor material may be N-doped. Hence, at the interface between the electrically conductive feature and the layer of first semiconductor material, electrons from the electrically conductive feature and holes from the layer of first semiconductor material may recombine with each other such that a negative space charge is created in the layer of first semiconductor material and a positive space charge is created in the electrically conductive feature. The presence of the space charges may lead to the creation of an electric field at the interface, wherein a polarity of the electric field is such that electrons approaching the interface are drawn towards the electrically conductive feature.

If an electric current is flowing through the electrically conductive feature, electrons which, in the N-doped second semiconductor material, are the majority charge carriers, may move through the electrically conductive feature. If an electron approaches the interface, the electric field which is present in the vicinity of the interface may draw the electron back into the electrically conductive feature. This may help avoid a scattering of electrons at the interface.

In other embodiments, the electrically conductive feature may comprise a P-doped semiconductor material and the layer of first semiconductor material may comprise an N-doped semiconductor material. In such embodiments, at the interface between the electrically conductive feature and the layer of first semiconductor material, an electric field, having a direction which is such that electrons are drawn towards the layer of first semiconductor material and holes are drawn towards the electrically conductive feature, may be formed.

If an electric current is flowing through the electrically conductive feature, holes, which, in the P-doped second semiconductor material, are the majority charge carriers, may move through the electrically conductive feature. If a hole approaches the interface between the electrically conductive feature and the layer of first semiconductor material, the electric field in the vicinity of the interface may draw the hole back into the electrically conductive feature. This may help reduce a likelihood of a scattering of the hole.

While, in some embodiments, substantially the entire electrically conductive feature may be formed from the second semiconductor material, in other embodiments, only a portion of the electrically conductive feature in the vicinity of the interface between the electrically conductive feature and the layer of first semiconductor material is formed from the second semiconductor material, whereas other portions of the electrically conductive feature may comprise a different material, for example, a metal. For example, the electrically conductive feature may comprise a layer of second semiconductor material formed over the layer of first semiconductor material, and a metal layer formed over the layer of second semiconductor material. A Schottky barrier and/or an ohmic barrier may be provided between the metal layer and the layer of second semiconductor material.

Figure 3A:
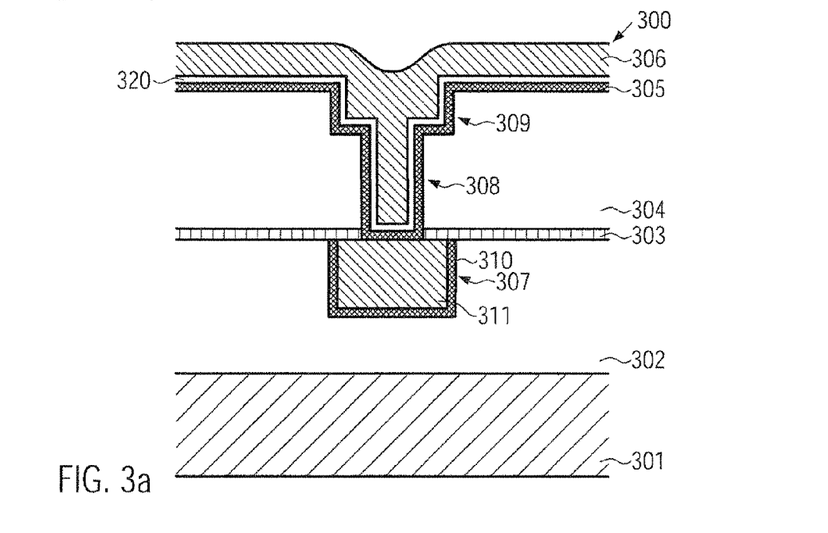
FIGS. 3a-3e show schematic cross-sectional views of a semiconductor structure in stages of a method of forming an electrically conductive line according to an illustrative embodiment disclosed herein.

FIG. 3a shows a schematic cross-sectional view of a semiconductor structure 300 in a first stage of a method of forming a semiconductor structure according one illustrative embodiment. The semiconductor structure 300 comprises a semiconductor substrate 301. The semiconductor substrate 301 may comprise a semiconductor wafer, for example, a silicon wafer of a type well known to persons skilled in the art, and may optionally comprise circuit elements such as transistors, capacitors and resistors formed therein and/or thereon. Additionally, the semiconductor substrate 301 may comprise electrically conductive lines in lower interconnect levels. On the substrate 301, a layer 302 of an electrically insulating material may be formed. The layer 302 may comprise an interlayer dielectric, such as silicon dioxide, silicon nitride, silicon oxynitride and/or a low-k material, for example, an organosilicate glass, known to persons skilled in the art.

In the layer 302 of electrically insulating material, a trench 307 may be formed. The trench 307 may comprise a trench fill 311 and a diffusion barrier layer 310 separating the trench fill 311 from the layer 302 of electrically insulating material. The trench fill 311 may comprise an electrically conductive material, for example, a metal such as copper. The diffusion barrier layer 310 may be adapted to substantially prevent or at least reduce a diffusion of the material of the trench fill 311 into the layer 302 of electrically insulating material and other components of the semiconductor structure 300.

Over the layer 302 of electrically insulating material, an etch stop layer 303 comprising a material which may be selectively etched with respect to the material of the layer 302 of electrically insulating material and a further layer 304 of electrically insulating material may be formed. In some embodiments, the layer 304 may comprise substantially the same material as the layer 302. In the layer 304 of electrically insulating material, a trench 309 and a contact via 308 may be formed.

The above-described features of the semiconductor structure 300 may be formed by means of techniques of deposition, oxidation, ion implantation, photolithography and etching well known to persons skilled in the art.

A diffusion barrier layer 305 may be deposited over the semiconductor structure 300. The diffusion barrier layer 305 may comprise a material adapted to substantially prevent or at least reduce a diffusion of an electrically conductive material, such as copper, through the diffusion barrier layer 305. In some embodiments, the diffusion barrier layer 305 may comprise titanium, titanium nitride, tantalum and/or tantalum nitride. The diffusion barrier layer 305 may be formed by means of deposition techniques well known to persons skilled in the art comprising, for example, chemical vapor deposition and/or plasma enhanced chemical vapor deposition.

A layer 320 comprising a semiconductor material may be formed over the diffusion barrier layer 305. This may be done by means of known deposition techniques such as chemical vapor deposition and/or plasma enhanced chemical vapor deposition. A layer 306 comprising an electrically conductive material may then be formed over the layer 320 of semiconductor material.

In some embodiments, the layer 306 of semiconductor material may comprise a metal, such as copper and/or a copper alloy. In such embodiments, the formation of the layer 306 may comprise forming a relatively thin seed layer (not shown) comprising the metal. This may be done by means of chemical vapor deposition, plasma enhanced chemical vapor deposition and/or an electroless deposition. Thereafter, a known electroplating process may be performed to deposit the layer 306. Other known deposition techniques may be used as well.

In some embodiments, the semiconductor material in the layer 320 may be adapted such that a Schottky barrier is formed between the layer 320 of semiconductor material and the layer 306 of electrically conductive material, and the semiconductor material may be P-doped. In one embodiment wherein the layer 306 of electrically conductive material comprises copper, the semiconductor material may comprise P-doped zinc oxide.

As persons skilled in the art know, at an interface between a metal and a P-doped semiconductor material, a Schottky barrier may be formed if a work function of the semiconductor material is greater than a work function of the metal. The work function of a material corresponds to a difference between the energy of an electron in vacuum and an energy of an electron at the Fermi level of the material. The work function of the semiconductor material may depend on the type of semiconductor material, and on the level of doping in the semiconductor material.

Figure 4:
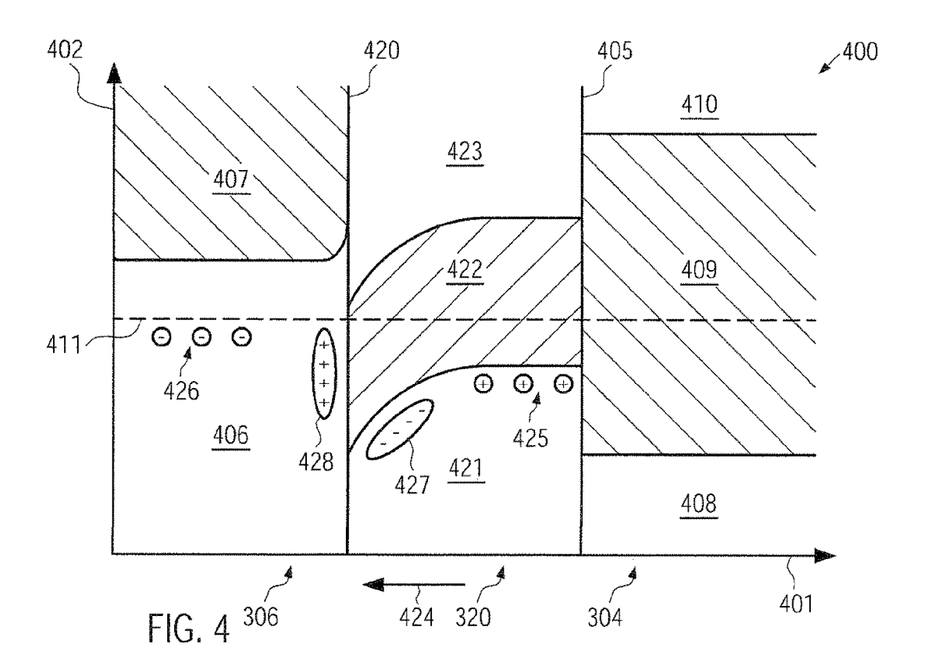
FIG. 4 shows a schematic band chart of an interface between an electrically conductive line and a dielectric layer in a semiconductor structure according to an illustrative embodiment disclosed herein.

FIG. 4 shows a schematic band chart 400 of a portion of the semiconductor structure 300 in an embodiment wherein the layer 306 of electrically conductive material comprises a metal and the layer 320 comprises a P-doped semiconductor material, and wherein the metal and the semiconductor material are selected such that a Schottky barrier is formed between the layers 306, 320. A first coordinate axis 401 denotes a position along a lateral direction being substantially parallel to the surface of the substrate 301, and a second coordinate axis 402 denotes an energy of electrons. A line 420 denotes a location of an interface between the layer 306 of electrically conductive material and the layer 320 of semiconductor material, and a line 405 denotes a location of an interface between the layer 320 of semiconductor material and the layer 304 of electrically insulating material. For simplicity, similar to FIG. 2 showing a band chart of a portion of a semiconductor structure according to the state of the art, the diffusion barrier layer 305 has been omitted.

The metal in the layer 306 of electrically conductive material comprises a conduction band 406 and an interband energy gap 407. A line 411 indicates a Fermi level of the semiconductor structure 300. As persons skilled in the art know, electron states having an energy smaller than the Fermi level 411 have a high probability of being occupied by an electron, and electron states having an energy higher than the Fermi level 411 have a low probability of being occupied by an electron. In embodiments wherein the layer 306 of electrically conductive material comprises a metal, the Fermi level 411 is in the conduction band 406, such that the conduction band 406 is partially filled with electrons. Reference numeral 426 schematically illustrates electrons having an energy in the vicinity of the Fermi level 411.

The semiconductor material of the layer 320 comprises a valence band 421 and a conduction band 423 which are separated from each other by an interband energy gap 422. Similarly, the electrically insulating material of the layer 304 comprises a valence band 408 and a conduction band 410 separated from each other by an interband energy gap 409.

As persons skilled in the art know, in semiconductor materials, as well as in electrically insulating materials, the Fermi level 411 is in the interband energy gap between the valence band and the conduction band. However, the interband energy gap 422 of the semiconductor material of the layer 320 may be smaller than the interband energy gap 409 of the electrically insulating material in the layer 304.

The location of the Fermi level 411 relative to the valence band 421 and the conduction band 423 of the material of the layer 320 of semiconductor material may be controlled by varying the doping of the layer 320 of semiconductor material. In embodiments wherein the layer 320 is P-doped, the Fermi level 411 may be relatively close to the valence band 421, as shown schematically in FIG. 4. Therefore, at typical temperatures of operation of the semiconductor structure 300, a portion of the electron states in the valence band 421 may be empty. Hence, holes may be present in the valence band 421, as indicated by reference numeral 425 in FIG. 4.

At the interface 420 between the layer 306 of electrically conductive material and the layer 320 of semiconductor material, a band bending may occur. Hence, in the vicinity of the interface 420, an energy of electron states at the top of the valence band 421 (and also an energy of electron states at the bottom of the conduction band 423) may be lower than in portions of the layer 320 of semiconductor material located at a moderate distance to the interface 420. Correspondingly, the energy of hole states in the valence band 421 may be higher in the vicinity of the interface 420 than in portions of the layer 320 located at a moderate distance to the interface 420.

Since charge carriers such as holes preferentially occupy states having a low energy, a concentration of the holes 425 in the vicinity of the interface 420 may be lower than in portions of the layer 320 located at a moderate distance to the interface 420. This may entail a negative space charge in the vicinity of the interface 420, as indicated by reference numeral 427 in FIG. 4. In the layer 306 of electrically conductive material, a positive space charge 428 may be formed in the vicinity of the interface 420.

From a slightly different point of view, the occurrence of the space charges 427, 428 may be understood as follows. At the interface 420, electrons from the layer 306 and holes from the layer 320 may recombine with each other. The recombination reduces the amount of electrons and holes in the vicinity of the interface 420, such that the balance of charge carriers is disturbed. The lack of positively charged holes in the layer 320 creates the negative space charge 427 and the lack of negatively charged electrons in the layer 406 creates the positive space charge 428.

The presence of the positive space charge 428 and the negative space charge 427 may create an electric field in the semiconductor structure 400. Electrons, which are negatively charged, are repelled by the negative space charge 427 and are attracted by the positive space charge 428. Therefore, a direction of the electric field is such that electrons are drawn in the direction indicated by arrow 424 in FIG. 4.

Figure 3B:
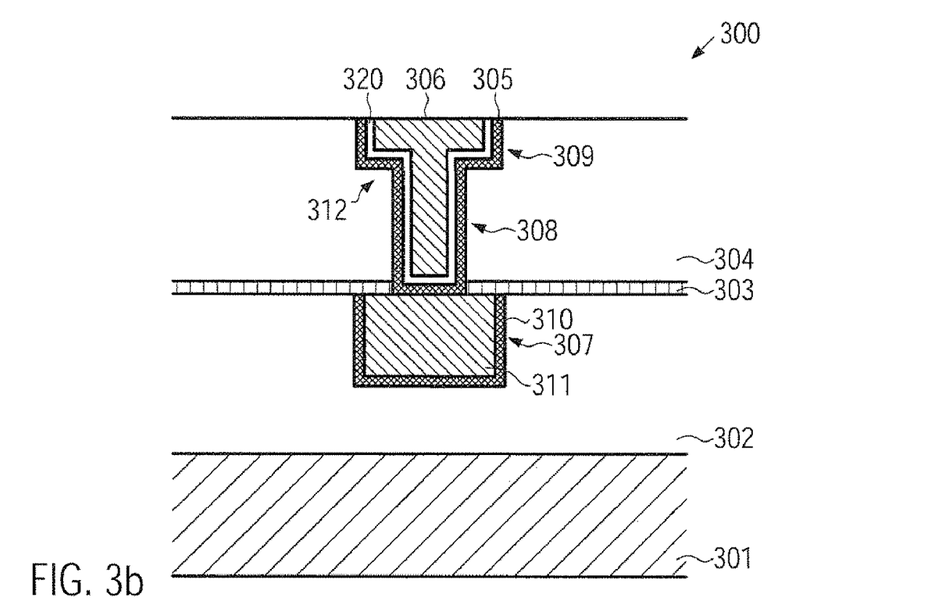

FIG. 3b shows a schematic cross-sectional view of the semiconductor structure 300 in a later stage of the manufacturing process. After the formation of the layer 306 of electrically conductive material, a chemical mechanical polishing process of a type known to persons skilled in the art may be performed. In the chemical mechanical polishing process, portions of the diffusion barrier layer 305, the layer 320 of semiconductor material and the layer 306 of electrically conductive material outside the trench 309 and the contact via 308 may be removed, and a substantially planar surface of the semiconductor structure 300 may be obtained. Portions of the layer 306 in the trench 309 may form an electrically conductive line 312, and portions of the layer 306 in the contact via 308 may provide an electrical connection between the electrically conductive line 312 and the trench fill 311 in the trench 307.

Figure 3C:
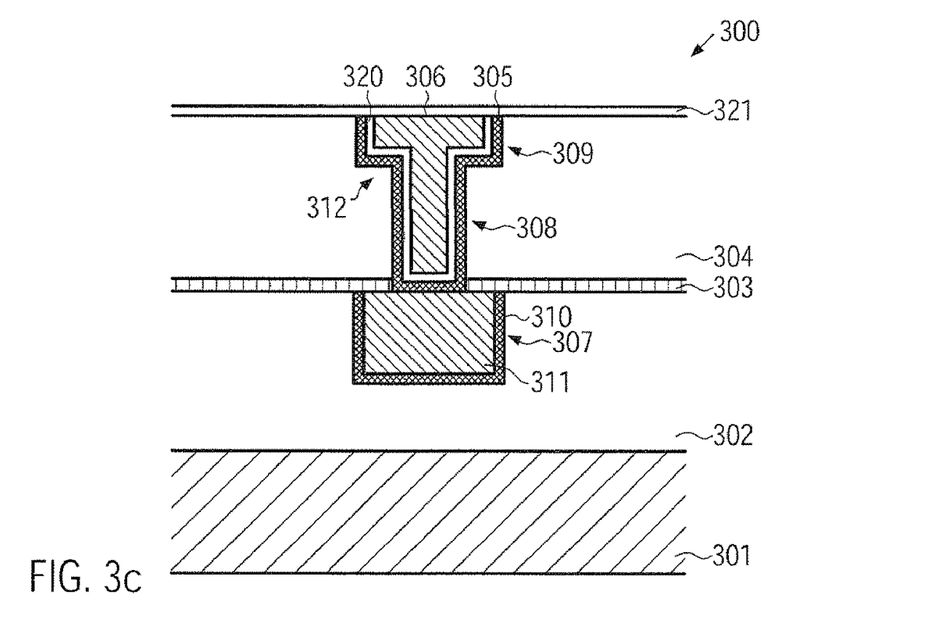

FIG. 3c shows a schematic cross-sectional view of the semiconductor structure 300 in a later stage of the manufacturing process. After the chemical mechanical polishing process, a layer 321 comprising a semiconductor material may be deposited by means of deposition techniques known to persons skilled in the art, such as chemical vapor deposition and/or plasma enhanced chemical vapor deposition. The layer 321 may comprise substantially the same semiconductor material as the layer 320. Hence, similar to the interface 420 (FIG. 4) between the layers 306, 320, space charges and an electric field may be created at an interface between the layer 306 and the layer 321. A direction of the electric field may be such that electrons are drawn in a direction from the layer 321 towards the layer 306.

The present invention is not restricted to embodiments wherein the entire layer 321 of semiconductor material is formed above the layer 304 of electrically insulating material, as shown in FIG. 3c. In other embodiments, a recess may be formed in the layer 306 before the formation of the layer 321, wherein a depth of the recess may be approximately equal to a thickness of the layer 321. This may be done by performing an etch process adapted to selectively remove the material of the layer 306, leaving the material of the layer 304 substantially intact. The depth of the recess may be controlled by varying the duration of the etch process. Thus, a portion of the layer 321 of semiconductor material over the electrically conductive line 312 may be provided inside the trench 309.

Figure 3D:
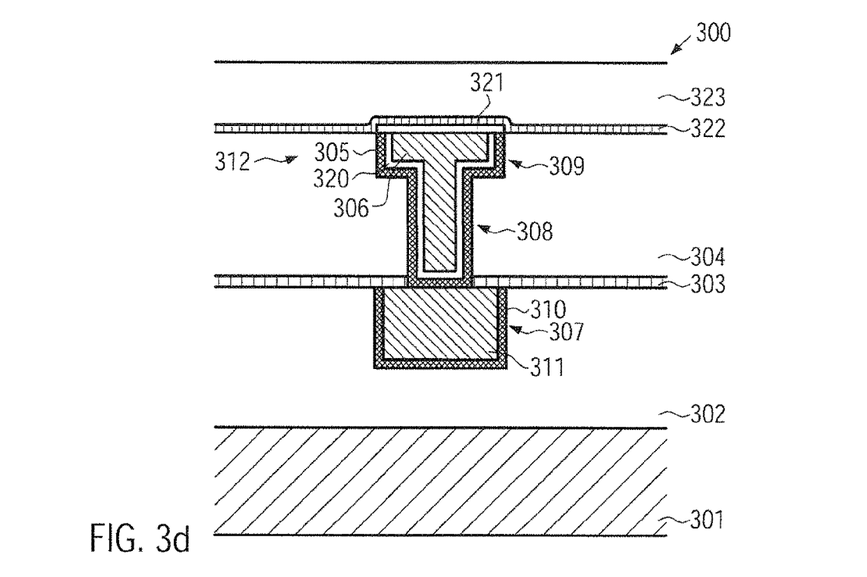

FIG. 3d shows a schematic cross-sectional view of the semiconductor structure 300 in a later stage of the manufacturing process. After the formation of the layer 321 of semiconductor material, portions of the layer 321 of semiconductor material which are not located over the trench 309 may be removed. This may help reduce the risk of shortcuts between the electrically conductive line 312 and other features (not shown) in the semiconductor structure 300 caused by electric conduction in the layer 321 of semiconductor material. The portions of the layer 321 of semiconductor material may be removed by means of a photolithographic process known to persons skilled in the art.

Thereafter, an etch stop layer 322 and a layer 323 of an electrically insulating material may be formed over the semiconductor structure 300. In some embodiments, the etch stop layer 322 may comprise substantially the same material as the etch stop layer 303, and the layer 323 of electrically insulating material may comprise substantially the same material as at least one of the layers 302, 304. The etch stop layer 322 and the layer 323 of electrically insulating material may be formed by means of deposition techniques well known to persons skilled in the art.

After the formation of the etch stop layer 322 and the layer 323 of electrically insulating material, a trench and a contact via similar to the trench 309 and the contact via 308 may be formed over the trench 309, and the trench, as well as the contact via, may be filled with an electrically conductive material separated from the layer 323 of electrically insulating material by a diffusion barrier layer and, optionally, a layer of semiconductor material similar to the layers 320, 321. Thus, electrically conductive lines may be formed in a plurality of interconnect levels.

The present subject matter is not restricted to embodiments wherein the trench fill 311 abuts the diffusion barrier layer 310, as shown in FIGS. 3a-3d. In other embodiments, a layer of semiconductor material similar to the layer 320 described above may be formed between the trench fill 311 and the diffusion barrier layer 310, and a further layer of semiconductor material similar to the layer 321 described above may be formed between the trench fill 311 and the etch stop layer 303.

If an electric current is flown through the electrically conductive line 312, in embodiments wherein the layer 306 of electrically conductive material comprises a metal, electrons may move through the layer 306. If an electron approaches the interface 420 (FIG. 4) between the layer 306 of electrically conductive material and the layer 320 of semiconductor material and/or the interface between the layer 306 and the layer 321 of semiconductor material, the electric field at the respective interface may exhibit a force on the electron. As detailed above, a direction of the force may be such that the electron is drawn in a direction from the respective layer of semiconductor material to the layer 306. Hence, the electron may be drawn away from the interface, back into the electrically conductive line 312. This may help reduce the likelihood of a scattering of the electron at the interface, and may help reduce an energy loss of the electron. Thus, the electric resistance of the electrically conductive line 312, as well as the electric resistance of the contact via 308 filled with the semiconductor layer 320 and the layer 306 of electrically conductive material, may be reduced.

The present invention is not restricted to embodiments wherein the electrically conductive material of the layer 306 comprises a metal and the layer 320 comprises a P-doped semiconductor material adapted such that a Schottky barrier is formed between the layers 306, 320. In other embodiments, the layer 306 may comprise a doped semiconductor material (denoted as "second semiconductor material" in the following) and the doping of the layer 320, the material of which will be denoted as "first semiconductor material" in the following, may be inverse to the doping of the layer 306. In one embodiment, the layer 306 may comprise a P-doped semiconductor material and the layer 320 may comprise an N-doped semiconductor material. In another embodiment, the layer 306 may comprise an N-doped semiconductor material and the layer 320 may comprise a P-doped semiconductor material.

In one embodiment, the layers 306, 320 may comprise silicon, for example, polycrystalline silicon. Other materials may be used as well.

At the interface between the layers 306, 320, a P-N transition may be formed. At the P-N transition, holes from the P-doped semiconductor material in one of the layers 306, 320 may recombine with electrons from the N-doped semiconductor material in the other of the layers 306, 320. Thus, in the N-doped semiconductor material, a positive space charge may be created, and a negative space charge may be created in the P-doped semiconductor material. The presence of the space charges may create an electric field, wherein a direction of the electric field is such that electrons, which are attracted by the positive space charge and are repulsed by the negative space charge, are drawn towards the N-doped semiconductor material, and holes, which are attracted by the negative space charge and are repulsed by the positive space charge, are drawn towards the P-doped material. As persons skilled in the art know, in a P-doped semiconductor material, holes are the majority charge carriers and, in an N-doped semiconductor material, electrons are the majority charge carriers. Hence, each species of charge carriers may be drawn towards the material wherein it is a majority charge carrier.

In embodiments wherein the second semiconductor material in the layer 306 comprises an N-doped semiconductor material and the layer 320 of the first semiconductor material comprises a P-doped semiconductor material, an electric current in the electrically conductive line 312 may be substantially transported by electrons, which, in the N-doped second semiconductor material, are the majority charge carriers. If an electron approaches the interface between the layers 306, 320, the electric field may accelerate the electron back into the layer 306. This may help reduce the likelihood of a scattering of the electron at the interface and, thus, may reduce an electric resistance of the electrically conductive line 312.

In embodiments wherein the second semiconductor material in the layer 306 is P-doped and the layer 320 comprises an N-doped semiconductor material, an electric current in the electrically conductive line 312 may be substantially transported by holes which, in the P-doped second semiconductor material, are the majority charge carriers. If a hole approaches the interface between the layers 306, 320, the electric field may accelerate the hole back into the layer 306. This may help reduce the likelihood of a scattering of the hole at the interface and, thus, may reduce an electric resistance of the electrically conductive line 312.

In some embodiments (see FIG. 3e), a sputtering process 325 may be performed to selectively remove a portion of the layer 320 of semiconductor material at the bottom of the contact via 308. To this end, after the deposition of the layer 320 of semiconductor material, the semiconductor structure 300 may be irradiated with ions of a non-doping element, for example, with ions of a noble gas, such as helium, neon, argon, krypton or xenon. An energy of the ions may be adapted such that the ions, when impinging on the layer 320, knock atoms out of the layer 320. This may lead to a removal of material from the layer 320.

Figure 3E:
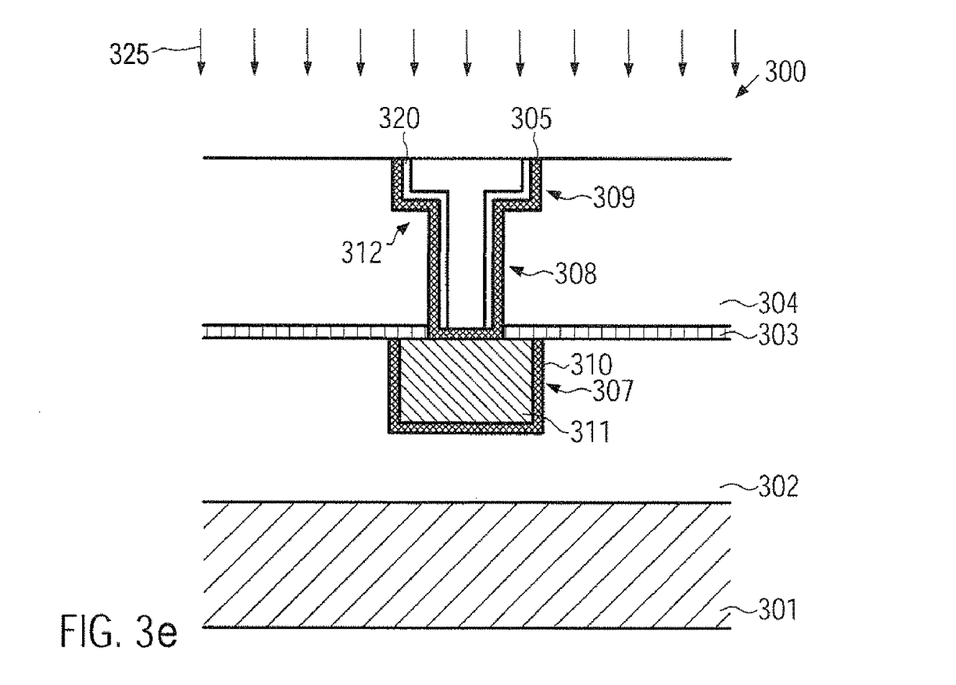

A direction of incidence of the ions may be substantially parallel to the sidewalls of the trench 309 and the contact via 308. Hence, a relatively small amount of ions may impinge on the sidewalls of the contact via 308 and the trench 309. Thus, a relatively small amount of the material of the layer 320 may be removed from the sidewalls of the contact via 308 and the trench 309.

The impact of ions at the bottom of the contact via 308 may remove portions of the material of the layer 320 of semiconductor material. The removed material may be deposited on the sidewalls of the contact via 308, such that a re-deposition of the material at the bottom of the contact via 308 may be substantially avoided. Hence, the diffusion barrier layer 305 may be exposed at the bottom of the contact via 308.

Ions impinging at the bottom surface of the trench 309 may knock out atoms from the portion of the layer 320 at the bottom of the trench 309. Since the trench 309 may be wider than the contact via 308, a likelihood of a deposition of the knocked out atoms on the sidewalls of the trench 309 may be relatively small such that significant re-deposition may occur at the bottom of the trench 309. Hence, a rate at which material is removed from the bottom of the trench 309 may be smaller than the rate at which material is removed from the bottom of the contact via 308. Thus, if the sputtering process is stopped as soon as the diffusion barrier layer 305 is exposed at the bottom of the contact via 308, the bottom surface of the trench 309 may still be covered by the semiconductor material of the layer 320.

Advantageously, removing a portion of the layer 320 of semiconductor material from the bottom of the contact via 308 may help provide a substantially ohmic contact between the layer 306 of electrically conductive material and the trench fill 311.

In other embodiments, a thickness of the layer 320 of semiconductor material may be relatively small. Thus, electrons and/or holes may tunnel through the Schottky barrier or the P-N transition, respectively, at the interface between the layer 306 of electrically conductive material and the layer 320 of semiconductor material. Thus, an electric current may flow between the layer 306 of electrically conductive material and the trench fill 311 in both directions.

The present subject matter is not restricted to embodiments wherein the electrically conductive line 312 is substantially homogeneous. In other embodiments, the electrically conductive line 312 may comprise portions which are formed from a different material than other portions of the electrically conductive line 312. For example, the electrically conductive line 312 may comprise a layer of second semiconductor material formed on the layer 320 which, in such embodiments, may comprise a first semiconductor material. Additionally, the electrically conductive line 312 may comprise a layer of a metal formed on the layer of the second semiconductor material.

A doping of the layer of the second semiconductor material may be inverse to the doping of the layer 320 of the first semiconductor material. Hence, a P-N transition may be formed at the interface between the layer of the second semiconductor material and the layer 320 of the first semiconductor material. In one embodiment, the first semiconductor material may be P-doped and the second semiconductor material may be N-doped.

The layer of the second semiconductor material and the metal layer in the electrically conductive line may be adapted such that a substantially ohmic contact is provided between the metal layer and the layer of the second semiconductor material. Hence, electrons may flow between the metal layer and the layer of semiconductor material in the electrically conductive line 312, but may be reflected at the P-N transition between the layer of the second semiconductor material and the layer 320 of the first semiconductor material. In further embodiments, a Schottky barrier may be formed between the metal layer and the layer of the second semiconductor material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:
   providing a semiconductor substrate comprising a layer of an electrically insulating material;
   forming a recess in said layer of electrically insulating material;
   depositing a first layer of doped semiconductor material in said recess;
   forming an electrically conductive feature on said first layer of doped semiconductor material, at least a portion of said electrically conductive feature being provided in said recess; and
   forming a second layer of semiconductor material on said electrically conductive feature.

2. The method of claim 1, wherein said formation of said electrically conductive feature comprises depositing a metal layer on said first layer of doped semiconductor material.

3. The method of claim 2, wherein a material of said first layer of doped semiconductor material has a work function greater than said metal layer.

4. The method of claim 3, wherein said metal layer comprises copper and said first layer of doped semiconductor material comprises zinc oxide.

5. The method of claim 4, wherein said dopant type of said first layer of doped semiconductor material is a P-type dopant.

6. The method of claim 1, further comprising forming a diffusion barrier layer between said layer of electrically insulating material and said first layer of doped semiconductor material, said diffusion barrier layer being adapted to reduce a diffusion of a material of said electrically conductive feature into said layer of insulating material.

7. The method of claim 1, wherein said first layer of doped semiconductor material and said second layer of semiconductor material are formed of substantially the same material.

8. The method of claim 1, wherein said electrically conductive feature comprises at least one of a trench and a contact via filled with an electrically conductive material.

9. A method of forming a semiconductor structure, comprising:
   forming a recess in a dielectric material layer formed above a semiconductor substrate;
   forming a first material layer in said recess, wherein forming said first material layer comprises depositing a layer of first doped semiconductor material; and
   forming a second material layer above said recess, wherein forming said second material layer comprises forming an electrically conductive material layer to fill said recess and thereafter forming a layer of second semiconductor material above said electrically conductive material layer.

10. The method of claim 9, wherein forming said electrically conductive material layer comprises depositing a metal layer.

11. The method of claim 10, wherein forming said first material layer further comprises depositing a diffusion barrier layer in said recess prior to depositing said layer of first doped semiconductor material, said diffusion barrier layer being adapted to reduce a diffusion of said electrically conductive material into said dielectric material layer.

12. A method of forming a semiconductor structure, comprising:
 forming an opening in a dielectric material layer formed above a semiconductor substrate, said opening comprising a trench and a contact via, said contact via connecting said trench to a conductive contact;
 depositing a diffusion barrier layer in said opening;
 depositing a first layer of doped semiconductor material above said diffusion barrier layer;
 depositing an electrically conductive metal layer above said first layer of semiconductor material, said electrically conductive metal layer filling said opening; and
 forming a second layer of semiconductor material above said electrically conductive metal layer.

13. The method of claim 12, further comprising performing a sputtering process adapted to selectively remove said first layer of semiconductor material at a bottom of said contact via and expose said diffusion barrier layer deposited above said conductive contact.

14. The method of claim 9, wherein a work function of said first doped semiconductor material is greater than a work function of said electrically conductive material.

15. The method of claim 12, wherein a work function of said first doped semiconductor material is greater than a work function of said electrically conductive metal.

16. A method of forming a semiconductor structure, comprising:
 providing a semiconductor substrate comprising a layer of an electrically insulating material;
 forming a recess in said layer of electrically insulating material;
 depositing a layer of doped semiconductor material comprising zinc oxide in said recess, wherein a dopant type of said doped semiconductor material is a P-type dopant;
 forming an electrically conductive feature comprising a metal layer on said layer of doped semiconductor material, wherein at least a portion of said electrically conductive feature is provided in said recess, said metal layer comprises copper, and said doped semiconductor material has a work function greater than said metal layer comprising copper.

17. A method of forming a semiconductor structure, comprising:
 providing a semiconductor substrate comprising a layer of electrically insulating material;
 forming a recess in said layer of electrically insulating material;
 depositing a first layer of doped semiconductor material in said recess; and
 forming an electrically conductive feature comprising depositing a second layer of doped semiconductor material on said first layer of doped semiconductor material, wherein at least a portion of said electrically conductive feature is provided in said recess, and a dopant type of said first layer of semiconductor material is inverse to a dopant type of said second layer of doped semiconductor material.

18. A method of forming a semiconductor structure, comprising:
 forming a recess in a dielectric material layer formed above a semiconductor substrate;
 forming a first material layer in said recess, wherein forming said first material layer comprises depositing a layer of first doped semiconductor material; and
 forming a second material layer above said recess, wherein forming said second material layer comprises forming an electrically conductive material layer to fill said recess, said electrically conductive material layer comprising a layer of second doped semiconductor material, a dopant type of said layer of first doped semiconductor material being inverse to a dopant type of said layer of second doped semiconductor material.

* * * * *